United States Patent [19]

Newkirk et al.

[11] 4,202,931
[45] * May 13, 1980

[54] SUPERCONDUCTING ARTICLES OF MANUFACTURE AND METHOD OF PRODUCING SAME

[75] Inventors: Lawrence R. Newkirk, Los Alamos; Flavio A. Valencia, Santa Fe, both of N. Mex.

[73] Assignee: The United States of America as represented by the United States Department of Energy, Washington, D.C.

[*] Notice: The portion of the term of this patent subsequent to Feb. 1, 1994, has been disclaimed.

[21] Appl. No.: 508,586

[22] Filed: Sep. 23, 1974

[51] Int. Cl.² ............................................. B05D 5/12
[52] U.S. Cl. .................................. 428/662; 29/599; 75/134 G; 75/174; 427/62; 427/124; 427/252; 428/674; 428/930; 428/938
[58] Field of Search ................ 117/107.2 R, 201, 227, 117/230; 427/62, 124, 252, 248, 318, 399; 29/599; 428/662, 674, 930, 938; 75/134 G, 174

[56] References Cited

U.S. PATENT DOCUMENTS

| | | |
|---|---|---|
| 2,680,085 | 1/1954 | Raeuber et al. ...................... 148/6.35 |
| 3,211,583 | 10/1965 | Riley ...................................... 117/227 |
| 3,421,951 | 1/1969 | Letter .................................... 427/399 |
| 3,525,637 | 8/1970 | Kim .................................. 117/107.2 R |
| 3,573,978 | 4/1971 | Kim et al. ....................... 117/107.2 R |
| 3,630,769 | 12/1971 | Hart et al. ............................ 117/227 |
| 4,005,990 | 2/1977 | Newkirk et al. .................. 74/134 G |
| 4,054,686 | 10/1977 | Newkirk et al. ..................... 428/930 |
| 4,128,121 | 12/1978 | Sigsbee ............................. 75/134 G |
| 4,129,166 | 12/1978 | Sigsbee ............................. 75/134 G |
| 4,129,167 | 12/1978 | Sigsbee .................................. 75/174 |

OTHER PUBLICATIONS

Chemical Abstracts 78 (1973) 89966, Abstract of Valueva et al. Izv. Akad. Nauk SSSR Neorg. Mater. 1972, 8(12) 2083-8.

Primary Examiner—William R. Dixon, Jr.
Attorney, Agent, or Firm—R. V. Lupo; Paul D. Gaetjens; Edward C. Walterscheid

[57] ABSTRACT

Bulk coatings of Nb₃Ge with high superconducting transition temperatures bonded to metallic substrates and a chemical vapor deposition method for producing such coatings on metallic substrates are disclosed. In accordance with the method, a Nb₃Ge coating having a transition temperature in excess of 21.5 K may be tightly bonded to a copper substrate.

8 Claims, 2 Drawing Figures

SUPERCONDUCTING ARTICLES OF MANUFACTURE AND METHOD OF PRODUCING SAME

BACKGROUND OF THE INVENTION

The invention described herein was made in the course of, or under, a contract with the U.S. Atomic Energy Commission.

It relates to a high-transition-temperature superconducting $Nb_3Ge$ coating and a method of applying such coating in a strongly adherent fashion to a metallic substrate, and more particularly to a method of bonding a bulk coating of $Nb_3Ge$ to a copper substrate.

There are numerous applications for articles of manufacture comprising an appropriate superconducting coating bonded to a desired metallic substrate. Thus, for example, present concepts for a direct current superconducting power transmission line envisage the use of conductors in a dual capacity to contain the cryogenic coolant and also to carry the superconducting current. In this type of design, a layer of superconducting material surrounds a tube carrying liquid helium. The tube must be a good thermal and electrical conductor to provide stability to the superconducting coating. The coating, in turn, must have a high transition temperature ($T_c$) and a critical current ($I_c$) and maintain good contact with the tube.

The art discloses that the superconducting material with the highest known transition temperature is niobium germanide ($Nb_3Ge$) having an A-15 structure. A transition temperature of 22.5° K. has been measured using small sections of an extremely thin film ($<0.1$ $\mu$m) of $Nb_3Ge$ deposited by sputtering under vacuum conditions. To the present inventors' knowledge, prior to commencement of their work, no technique had been devised for coating a strongly adherent bulk layer of $Nb_3Ge$ with the A-15 structure to a metallic substrate.

It has been reported that single-phase $Nb_3Ge$ having a transition temperature in the range of 17.5° to 19° K. has been prepared by the coreduction of $NbCl_5$ and $GeCl_4$ in the presence of hydrogen. Two types of reactor have been used for this purpose. In one, the $Nb_3Ge$ has been deposited on a heated molybdenum wire and in the other it has been deposited on a heated quartz tube. In either case, the deposit has not adhered firmly or bonded to the substrate. See Valueva et al., "Preparation of Nb Germanides by Coreduction of the Higher Chlorides by Hydogen," Izvestiya Akademii Nauk SSSR, Neorganicheskie Materialy, vol. 8, No. 12, pp 2083-2088 (December 1972).

SUMMARY OF THE INVENTION

We have now found that a bulk coating of $Nb_3Ge$ with a transition temperatue in excess of 20° K. can be firmly bonded to an appropriate metal substrate through an improved chemical vapor deposition technique. A critical feature of this technique is uniform dispersal and vaporization of $NbCl_5$ powder in a flowing mixture of an inert gas (e.g., Ar), $GeCl_4$, and hydrogen. The vaporization can readily be made to occur at a temperature between 400° and 600° C. The heated gas-vapor mixture is then flowed over the substrate where it is heated to a temperature at which coreduction of the $NbCl_5$ and $GeCl_4$ by the hydrogen is initiated. The molar ratio of Nb, Ge, and $H_2$ in the flowing gas-vapor mixture is chosen such as to produce chemical vapor deposition of $Nb_3Ge$ having an A-15 structure when the coreduction is initiated. A preferred ratio of Nb:Ge for this purpose is in the range of 2.3-3.0:1 and a preferred deposition temperature is in the range of about 890° to 900° C.

Preferred metallic substrates include copper, steel, and stainless steel. If a substrate, such as copper or steel, is used which may surface oxidize, it is desirable that, prior to chemical vapor deposition of the $Nb_3Ge$, hydrogen be passed over the substrate at a temperature and for a time sufficient to reduce any surface oxides present on the substrate.

DESCRIPTION OF THE PREFERRED EMBODIMENTS

Figure 1:
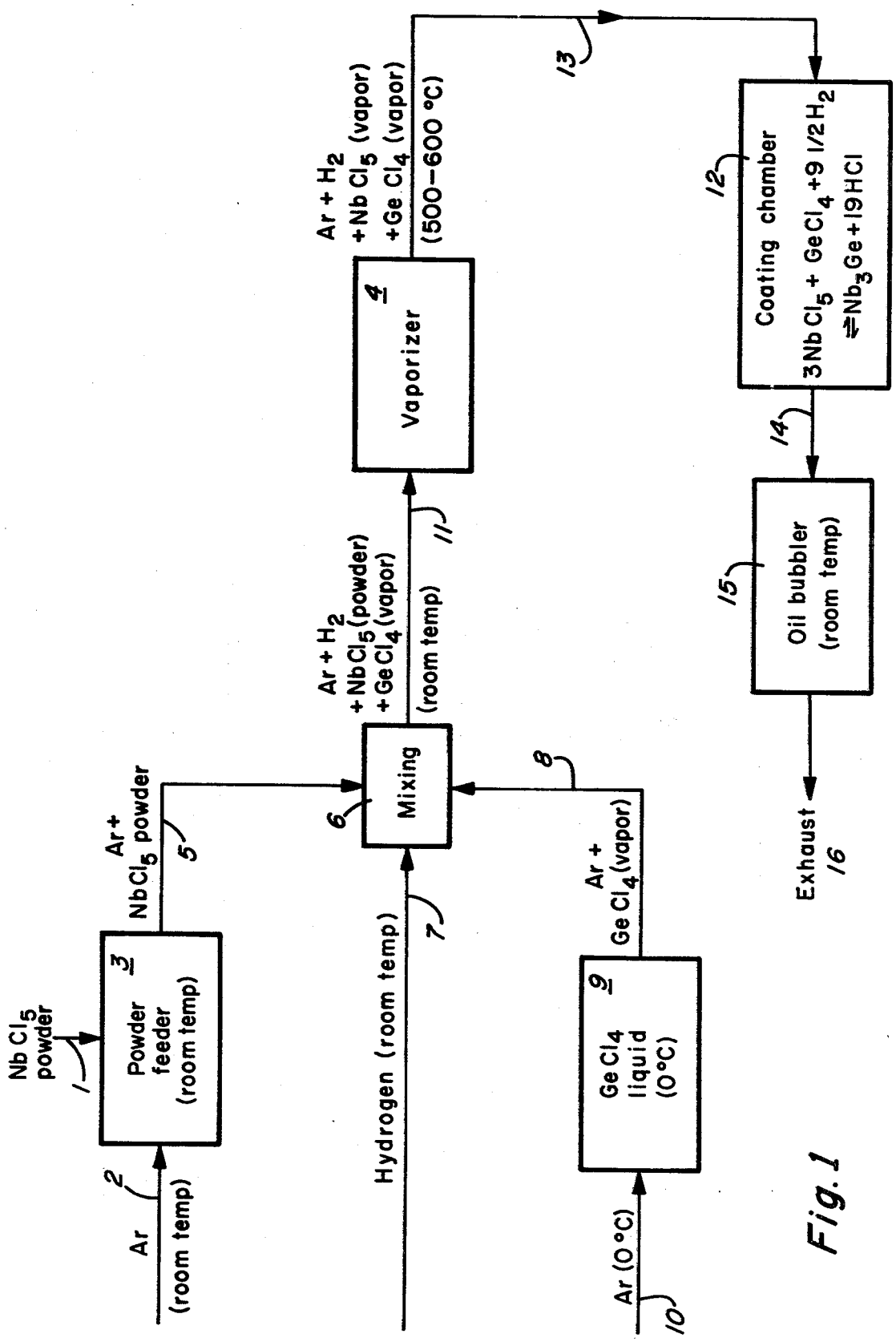
FIG. 1 is a flow chart of the process of the invention.

Niobium germanide ($Nb_3Ge$) is readily formed as a strongly adherent bulk coating bonded to a metallic substrate in accordance with the process shown in the flow chart of FIG. 1. The basic process consists of coreduction of $NbCl_5$ and $GeCl_4$ in appropriate molar ratio by hydrogen gas on a hot metallic substrate. Niobium pentachloride powder 1 is entrained in a flow of inert gas 2, preferably argon, by means of powder feeder 3. A powder feeder of the type sold under the tradename "Plasmatron" by Plasmadyne Division of Geotel Inc. is suitable for this purpose. To ensure a uniform composition of $Nb_3Ge$, it is essential that the $NbCl_5$ powder be uniformly entrained in the gas flow at a predetermined rate so as to avoid any substantial variation in the molar ratio of Nb to Ge in the gas-vapor mixture which is reduced by the hot hydrogen gas. This may readily be accomplished if $NbCl_5$ powder 1 is first screened to $-100$ mesh (U.S. screen) before being introduced into powder feeder 3.

Prior to entering vaporizing chamber 4, the inert gas stream 5 carrying entrained $NbCl_5$ powder is mixed 6 with a hydrogen gas stream 7 and a second inert gas stream 8, again preferably argon, carrying $GeCl_4$ vapor. Stream 8 is formed by passing argon or another inert gas 10 at 0° C. through a bubbler 9 containing liquid $GeCl_4$ maintained at 0° C. in an ice bath at a rate such that the desired amount of $GeCl_4$ vapor is picked up in stream 8. After mixing 6, the combined stream 11 at or near room temperature enters vaporizer chamber 4. Chamber 4 is typically made of nickel and has a number of nickel baffles contained therein to prevent unvaporized $NbCl_5$ powder from being carried into coating chamber 12. It is maintained at about 500° C. which is more than sufficient to vaporize the $NbCl_5$ but not sufficient to induce significant reduction. Typically, the temperature may range between 400° and 600° C., but preferably is maintained at near 500° C. or higher so as to minimize any cooling of coating chamber 12 by gas-vapor mixture 13.

In coating chamber 12, the heated gas-vapor mixture 13 is flowed over a metallic substrate heated sufficiently to drive the reaction

$$3NbCl_5 + GeCl_4 + 9.5H_2 \rightleftharpoons Nb_3Ge + 19HCl.$$

This reaction, when driven to the right, results in the chemical vapor deposition of $Nb_3Ge$ on the substrate. The optimum temperature for producing $Nb_3Ge$ having the highest transition temperature appears to be in the range of 890° to 900° C. However, Nb$_3$Ge with a transition temperature in excess of 18° K. has readily been deposited at 830° C. and also at 920° C. The minimum temperature at which Nb$_3$Ge may be produced in accordance with this reaction is near 650° C.

A preferred metallic substrate is copper, but substrates such as, e.g., steel and stainless steel are also appropriate. Useful substrates are those which retain their integrity during the coating process, i.e., they do not melt or hydride. Preferred substrates are those capable of forming a diffusion bond with the Nb$_3$Ge.

Figure 2:
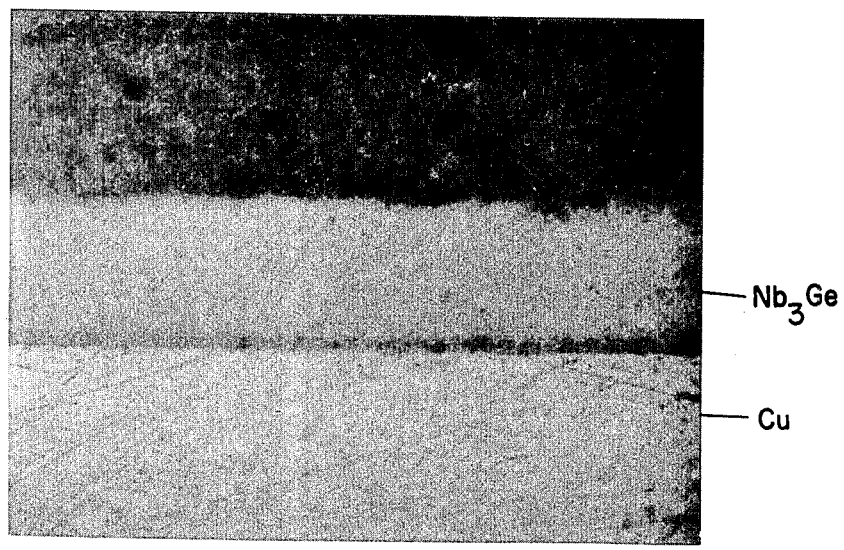
FIG. 2 is a photomicrograph of a cross section of $Nb_3Ge$ deposited on a copper substrate.

Examination of FIG. 2, which is a photomicrograph of a cross section of an Nb$_3$Ge coat and Cu substrate, indicates that the interface between the Nb$_3$Ge coat and the Cu substrate is relatively uniform and smooth. There are insufficient irregularities to account for the extremely good adherence on the basis of mechanical bonding, which immediately implies that a metallurgical or diffusion bond must exist. This is further supported by the knowledge that Cu readily dissolves Ge in solid solution.

A mixture 14 of HCl, unreacted H$_2$, NbCl$_5$, and GeCl$_4$, and inert gas flows from chamber 12 through an oil bubbler 15 and into an exhaust 16.

When a metallic substrate is used which can form oxides, as, for example, copper or steel, it is advantageous to pass a mixture of inert gas and hydrogen through the hot coating chamber for a time sufficient to reduce any surface oxides present on the substrate. This then presents a very clean surface for the chemical vapor deposition of the Nb$_3$Ge and allows an excellent bond to form between the Nb$_3$Ge coating and the substrate. Thus, for example, the surface of a copper substrate may readily be cleaned in this fashion by using the same flow and temperature conditions as those for coating but not permitting any NbCl$_5$ and GeCl$_4$ in the gas mixture for a period of 15 to 30 minutes prior to commencement of chemical vapor deposition.

The optimum value for the mole ratio of Nb:Ge in gas mixture 13 entering coating chamber 12 is closely related to the H$_2$:salt and Ar:salt mole ratios. A preferred Nb:Ge mole ratio is in the range of 2.3–3.0:1. It is desired to have the largest fraction of GeCl$_4$ in gas mixture 13 consistent with deposition of Nb$_3$Ge having the A-15 structure. If, however, for a given set of conditions, too much GeCl$_4$ is present in the gas stream, the nonsuperconducting compound Nb$_5$Ge$_3$ will be formed. The percentage of GeCl$_4$ which the gas mixture 13 may contain at a given coating temperature and still deposit A-15 Nb$_3$Ge is controlled by the H$_2$:salt mole ratio and the amount of dilution with Ar, i.e., the gas-to-salt mole ratio. In general, the more dilute the salt is, i.e., the higher the H$_2$:salt mole ratio, the more GeCl$_4$ can be introduced into the gas stream without producing Nb$_5$Ge$_3$. The desired dilution is readily accomplished by reducing the total salt delivery and increasing the H$_2$ flow.

This is best illustrated as follows. With an H$_2$:Ar:(NbCl$_5$+GeCl$_4$) mole ratio of about 20:12:1, the maximum amount of GeCl$_4$ which can be included in gas stream 13 corresponds to a mole ratio of Nb:Ge of about 5.5:1. This results in a material with a transition temperature of less than 6° K. However, at a mole ratio of H$_2$:Ar:(NbCl$_5$+GeCl$_4$) of about 85:75:1, the maximum amount of GeCl$_4$ which can be included in gas stream 13 corresponds to a mole ratio of Nb:Ge of about 2.3:1. This results in a material having a transition temperature in excess of 21° K.

The following examples of coatings were obtained in accordance with the flow chart of FIG. 1 utilizing the parameters indicated within each example. For these examples, coating chamber 12 consisted of an inner tube of copper and an outer tube of nickel. Gas mixture 13 was flowed through the copper tube and the chemical vapor deposition occurred on the inner wall of the tube. The outer nickel tube served to protect the copper tube from direct exposure to atmosphere, provided strength to support the copper tube, and produced a more uniform temperature distribution on the copper tube than if it had been exposed directly to the furnaces. The temperature of the copper tube was measured by means of bare chromel-alumel thermocouples passed through holes in the nickel tube and pressed against the outside of the copper tube.

EXAMPLE I

| | |
|---|---|
| Length of run | 30 min |
| Substrate | Copper ($\frac{7}{8}$" o.d × 0.035" wall, hard drawn) |
| GeCl$_4$ delivered | 7.8 g |
| NbCl$_5$ delivered | 23 g |
| Hydrogen flow | 8 liters/min |
| Argon flow | 7.75 liters/min |
| Substrate Temperature | 895° C. |
| Vaporizer Temperatue | 490° C. |
| Weight of deposited material | 6.3 g |
| Maximum superconducting transition temperature (inductive onset) | 20.7 K |
| Transition temperature distribution (inductive onset) Distance from inlet end (inches) | |
| 5 | 20K |
| 6 | 20.4 K |
| Current density at 6 inches from inlet end | 50,000 A/cm$^2$ @ 18.2 K |
| Lattice parameter corresponding to maximum transition temperature | 5.147 Å |

EXAMPLE 2

| | |
|---|---|
| Length of run | 30 min |
| Substrate | Copper ($\frac{7}{8}$" o.d. × 0.035" wall, hard drawn) |
| GeCl$_4$ deliverd | 6.7 g |
| NbCl$_5$ delivered | 23 g |
| Hydrogen flow | 8 liters/min |
| Argon flow | 7.7 liters/min |
| Substrate temperature | 895° C. |
| Vaporizer temperature | 490° C. |
| Weight of deposited material | 5.5 g |
| Maximum superconducting transition temperature (inductive onset) | 19.8 K |
| Transition temperature distribution (inductive onset) Distance from inlet end (inches) | |
| 6 | 19.4 K |
| 9 | 19.8 K |
| 12 | 19.1 K |
| Current density | Not measured |
| Lattice parameter corresponding to maximum transition temperature | Not measured |

EXAMPLE 3

| | |
|---|---|
| Length of run | 30 min |
| Substrate | Copper (⅜" o.d. × 0.035" wall, hard drawn) |
| $GeCl_4$ delivered | 6.6 g |
| $NbCl_5$ delivered | 23 g |
| Hydrogen flow | 5 liters/min |
| Argon flow | 7.7 liters/min |
| Substrate temperature | 895° C. |
| Vaporizer temperature | 490° C. |
| Weight of deposited material | 4.9 g |
| Maximum superconducting transition temperature (inductive onset) | 19.5 K |
| Transition temperature distribution (inductive onset) Distance from inlet end (inches) | |
| 6 | 19.5 K |
| 9 | 19.2 K |
| 12 | 18.0 K |
| 3 | 18.2 K |
| Current density at 6 inches from inlet end | 50,000 A/cm² @ 17 K |
| Lattice parameter corresponding to maximum transition temperature | Not measured |

EXAMPLE 4

| | |
|---|---|
| Length of run | 30 min |
| Substrate | Copper (⅜- o.d. × 0.035" wall, hard drawn) |
| $GeCl_4$ delivered | 5.6 g |
| $NbCl_5$ delivered | 23 g |
| Hydrogen flow | 5 liters/min |
| Argon flow | 7.6 liters/min |
| Substrate temperature | 890° C. |
| Vaporizer temperature | 490° C. |
| Weight of deposited material | 4.0 g |
| Maximum superconducting transition temperature (inductive onset) | 18.1 K |
| Transition temperature distribution (inductive onset) Distance from inlet end (inches) | |
| 6 | 18.2 K |
| 9 | 17.1 K |
| 12 | 15.5 K |
| Current density | Not measured |
| Lattice parameter corresponding to maximum transition temperature | Not measured |

EXAMPLE 5

| | |
|---|---|
| Length of run | 36 min |
| Substrate | Copper (⅜" o.d. × 0.035" wall, hard drawn) |
| $GeCl_4$ delivered | 5.7 g |
| $NbCl_5$ delivered | 71.5 g |
| Hydrogen flow | 5 liters/min |
| Argon flow | 3.5 liters/min |
| Substrate temperature | 800° C. at inlet end |
| | 900° C. at exhaust end |
| Vaporizer temperature | 500° C. |
| Weight of deposited material | 9.0 g |
| Maximum superconducting transition temperature (inductive onset) | 7.9 K |
| Transition temperature distribution (inductive onset) | |

*-continued*

| | |
|---|---|
| Distance from inlet end (inches) | |
| 6 | 5.8 K |
| 12 | 7.0 K |
| 18 | 7.7 K |
| 21 | 7.9 K |
| Current density | Not measured |
| Lattice spacing | Not measured |

EXAMPLE 6

| | |
|---|---|
| Length of run | 30 min |
| Substrate | Copper (⅜" o.d. × 0.035" wall, hard drawn) |
| $GeCl_4$ delivered | 3.3 g |
| $NbCl_5$ delivered | 66.5 g |
| Hydrogen flow | 5 liters/min |
| Argon flow | 3.4 liters/min |
| Substrate temperature | 800° C. at inlet end |
| | 900° C. at exhaust end |
| Vaporizer temperature | 490° C. |
| Weight of deposited material | 7.7 g |
| Maximum superconducting transition temperature (inductive onset) | <4 K |
| Transition temperature distribution (inductive onset) Distance from inlet end (inches) | |
| 6 | <4 K |
| 12 | <4 K |
| 18 | <4 K |
| Current density | Not measured |
| Lattice parameter | Not measured |

Chemical vapor deposition of the $Nb_3Ge$ coating on a metallic substrate is not limited to the configuration used with the preceding examples. Thus, alternatively, the coating may be accomplished with the substrate configured to the outside surface of a tube, the surface of a wire, or a number of wires, a flat tape of any width, or any irregular geometry such as might be used as a connector, joint, elbow, etc.

What we claim is:

1. A process for forming a bulk coating of $Nb_3Ge$ bonded to a copper substrate which comprises (a) uniformly entraining $NbCl_5$ powder in an argon gas stream, (b) forming a stream of argon gas and $GeCl_4$ vapor, (c) mixing said streams together and with hydrogen in a molar ratio which on the coreduction of said $NbCl_5$ and $GeCl_4$ by said hydrogen produces $Nb_3Ge$, (d) heating the resulting gas mixture containing said entrained $NbCl_5$ powder to a temperature of 400° to 600° C., (e) flowing the resulting heated gas-vapor mixture over said copper substrate, and (f) heating said copper substrate and said gas-vapor mixture to a temperature greater than 650° C. to chemically vapor deposit $Nb_3Ge$ on said copper substrate.

2. The process of claim 1 wherein, prior to said chemical vapor deposition, hydrogen is flowed over said copper substrate for a time and at a temperature sufficient to reduce surface oxides on said substrate.

3. The process of claim 2 wherein said $NbCl_5$ powder is screened to −100 mesh or less and is vaporized at a temperature of about 500° C.

4. The process of claim 1 wherein the Nb:Ge molar ratio in said mixture of $NbCl_5$ vapor, $GeCl_4$ vapor, hydrogen, and argon is in the range of 2.3-3.0:1 and said chemical vapor deposition occurs at a temperature in the range of about 890° to 900° C.

5. An article of manufacture which comprises Nb$_3$Ge bonded to a copper substrate made in accordance with the process of claim 1.

6. The article of manufacture of claim 5 wherein said Nb$_3$Ge has the A-15 structure and a transition temperature in excess of 20° K.

7. The article of manufacture of claim 6 wherein said Nb$_3$Ge is diffusion bonded to said copper.

8. In a process for the chemical vapor deposition of Nb$_3$Ge on a metallic substrate by the coreduction of NbCl$_5$ vapor and GeCl$_4$ vapor by hydrogen at a temperature greater than 650° C., the improvement comprising (a) uniformly entraining NbCl$_5$ powder in an inert gas stream, and (b) completely vaporizing the resulting entrained NbCl$_5$ powder uniformly at a temperature between 400° and 600° C.; mixing hydrogen gas and GeCl$_4$ vapor with said NbCl$_5$ powder entrained in said inert gas and heating the resulting gas mixture to a temperature of 400° to 600° C. to vaporize said NbCl$_5$ powder; flowing said heating gas mixture over a copper substrate and heating said substate and said gas mixture to a temperature greater than 650° C.

* * * * *